United States Patent
Bae et al.

(10) Patent No.: US 9,768,789 B2
(45) Date of Patent: Sep. 19, 2017

(54) REFERENCELESS AND MASTERLESS GLOBAL CLOCK GENERATOR WITH A PHASE ROTATOR-BASED PARALLEL CLOCK DATA RECOVERY

(71) Applicant: Korea Advanced Institute of Science and Technology, Daejeon (KR)

(72) Inventors: Hyeon Min Bae, Daejeon (KR); Joon-Yeong Lee, Gangwon-do (KR)

(73) Assignee: Korea Advanced Insitute of Science and Technology, Daejeon (KR)

( * ) Notice: Subject to any disclaimer, the term of this patent is extended or adjusted under 35 U.S.C. 154(b) by 0 days.

(21) Appl. No.: 15/110,912

(22) PCT Filed: Feb. 5, 2014

(86) PCT No.: PCT/KR2014/000993
§ 371 (c)(1),
(2) Date: Jul. 11, 2016

(87) PCT Pub. No.: WO2015/119308
PCT Pub. Date: Aug. 13, 2015

(65) Prior Publication Data
US 2016/0336942 A1    Nov. 17, 2016

(51) Int. Cl.
*H04L 7/033* (2006.01)
*H03L 7/08* (2006.01)
*H03L 7/07* (2006.01)
*H03L 7/081* (2006.01)
*H03L 7/113* (2006.01)
*H03L 7/18* (2006.01)
*H04L 7/04* (2006.01)

(52) U.S. Cl.
CPC .............. *H03L 7/0807* (2013.01); *H03L 7/07* (2013.01); *H03L 7/0814* (2013.01); *H03L 7/113* (2013.01); *H03L 7/1806* (2013.01); *H04L 7/04* (2013.01)

(58) Field of Classification Search
USPC .......................... 375/238, 355, 374; 370/208
See application file for complete search history.

(56) References Cited

U.S. PATENT DOCUMENTS

| | | | | |
|---|---|---|---|---|
| 6,628,605 | B1 * | 9/2003 | Chang | H04J 3/0685 370/208 |
| 9,344,269 | B2 * | 5/2016 | Shibasaki | H03L 7/0891 |
| 2006/0215296 | A1 | 9/2006 | Latchman | |
| 2009/0290672 | A1 * | 11/2009 | Ho | H03L 7/0814 375/374 |

(Continued)

FOREIGN PATENT DOCUMENTS

| | | |
|---|---|---|
| JP | 2012-044446 | 3/2012 |
| KR | 10-2008-0021212 | 3/2008 |

OTHER PUBLICATIONS

International Search Report, International Patent Application No. PCT/KR2014/000993, mailed Nov. 5, 2014.

*Primary Examiner* — Eva Puente
(74) *Attorney, Agent, or Firm* — Casimir Jones, SC

(57) ABSTRACT

The CDR (Clock Data Recovery) device may include at least one or more CDR channels configured to receive input data stream; and a global clock generator configured to provide a frequency locked clock to each of the at least one or more CDR channels, wherein each of the at least one or more CDR channels creates a reference clock signal for the global clock generator.

9 Claims, 3 Drawing Sheets

(56) References Cited

U.S. PATENT DOCUMENTS

2011/0194660 A1* 8/2011 Kenney ................ H03L 7/0807
  375/355
2012/0166859 A1   6/2012 Fernald et al.
2013/0070835 A1* 3/2013 Sindalovsky ........... H03L 7/087
  375/238
2013/0107997 A1   5/2013 Chen

* cited by examiner

[Fig. 1]
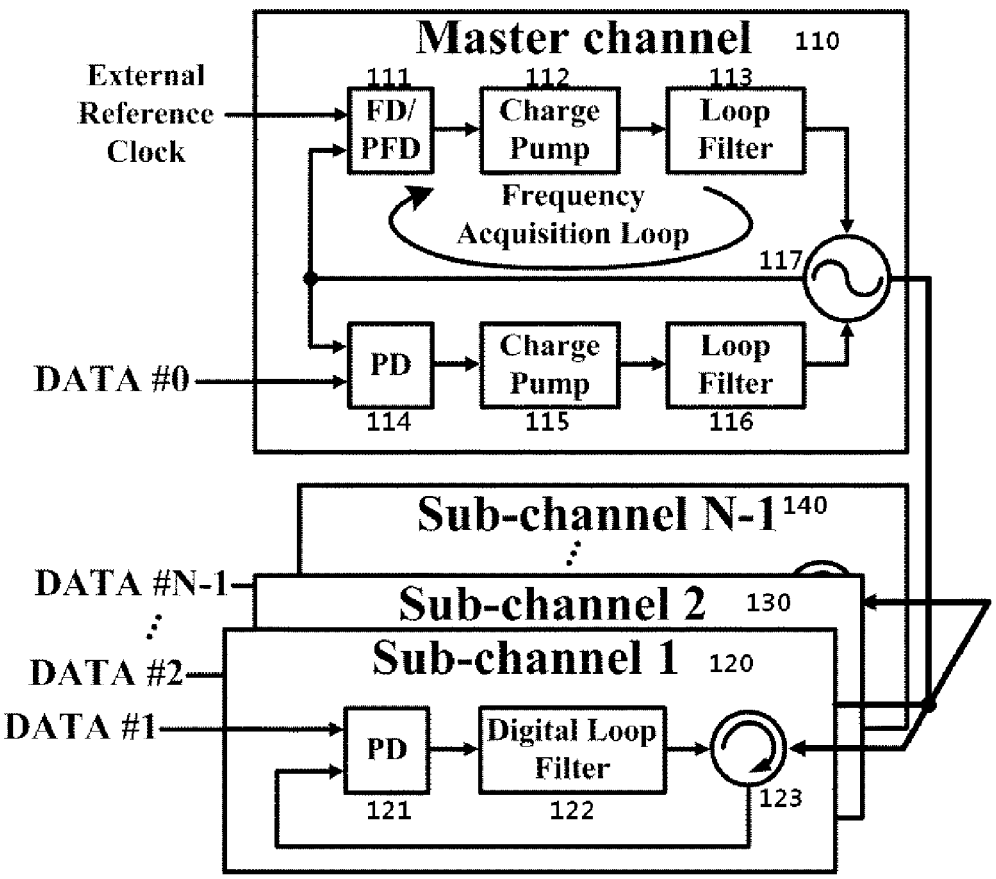
[Fig. 2]
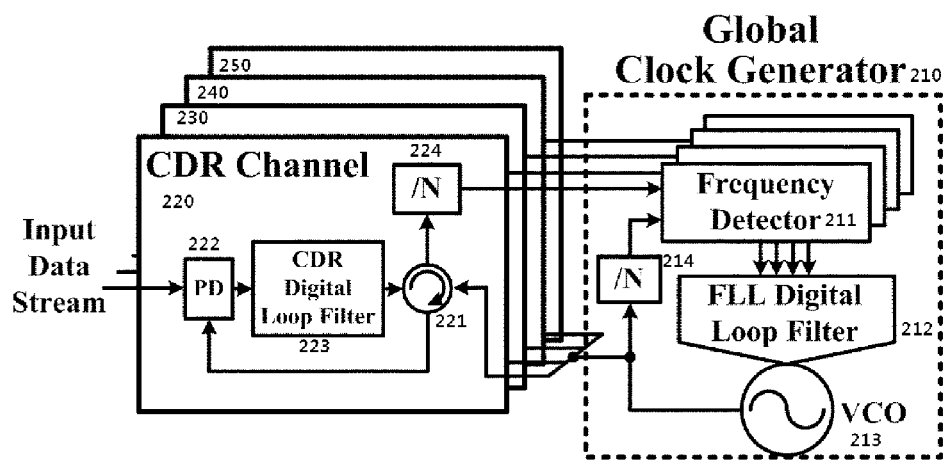

[Fig. 3]
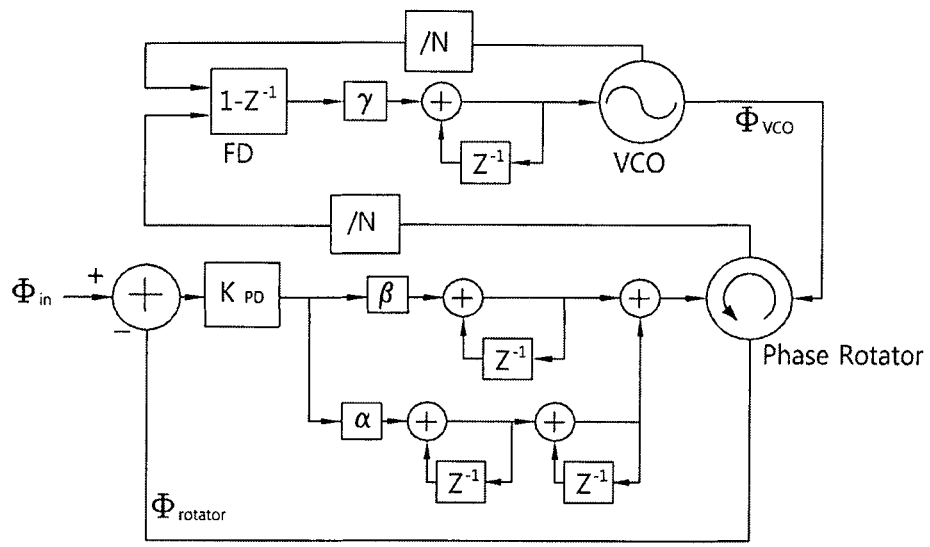
[Fig. 4]
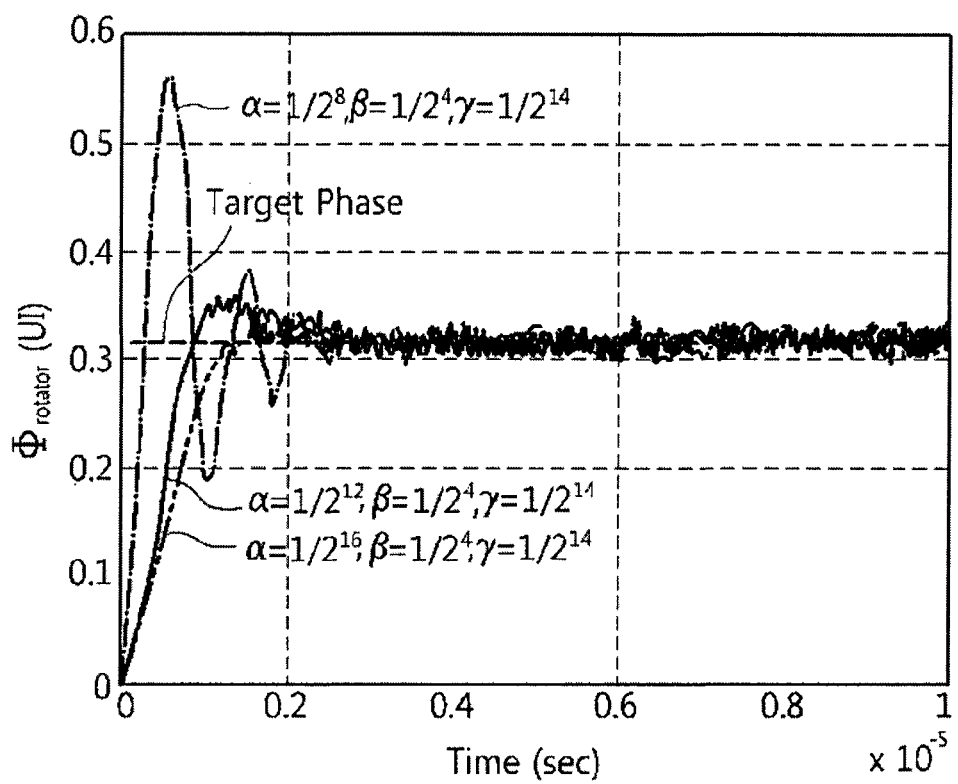

[Fig. 5]
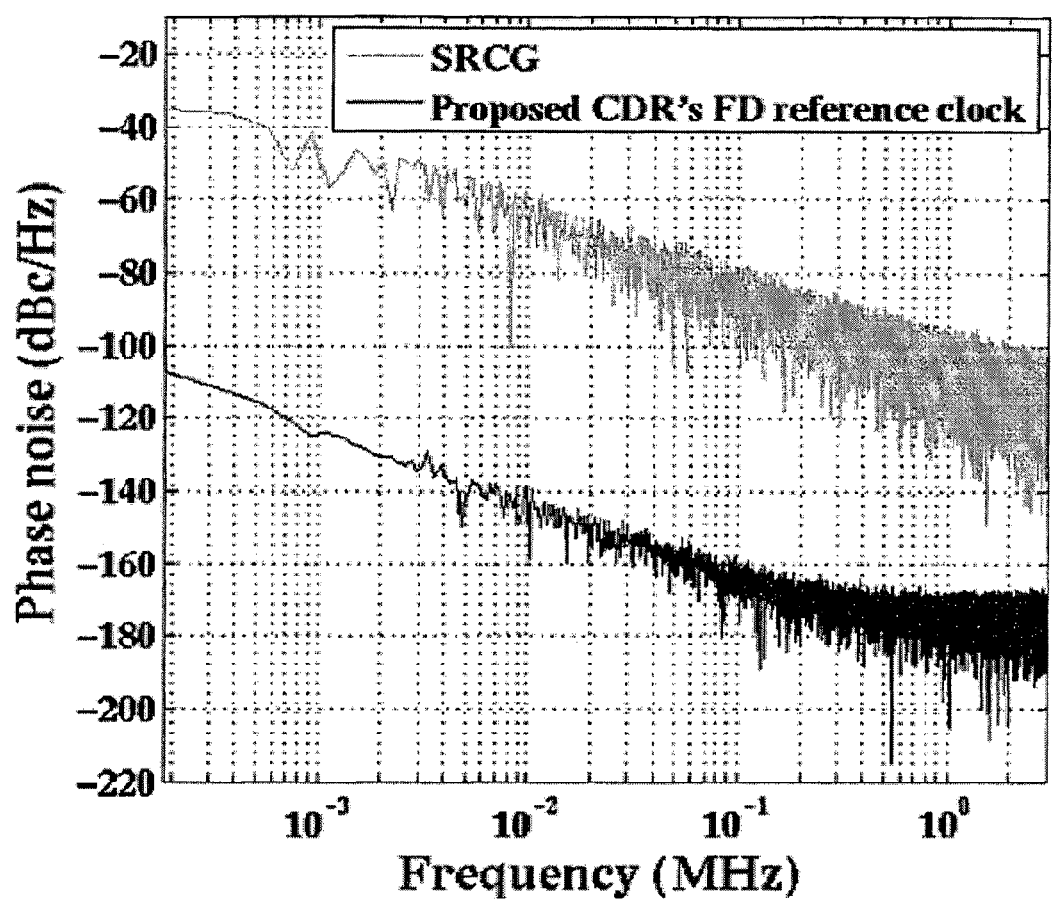

REFERENCELESS AND MASTERLESS GLOBAL CLOCK GENERATOR WITH A PHASE ROTATOR-BASED PARALLEL CLOCK DATA RECOVERY

TECHNICAL FIELD

Exemplary embodiments of the present invention relate to a phase rotator based clock and data recovery (CDR) apparatus with a referenceless and masterless clock generator.

BACKGROUND ART

FIG. 1 is a view illustrating an example of a block diagram of a typical rotator-based BB CDR with a clock generator according to an exemplary embodiment of the present invention.

Referring to FIG. 1, the master channel 110 of a phase rotator-based CDR may include a frequency detector (FD, 111) or a phase frequency detector (PFD, 111), a charge pump 112, a loop filter 113, a phase detector 114, a charge pump 115, a loop filter 113, and a voltage controlled oscillator 117. And, each of sub-channel 1 (120), sub-channel 2 (130), . . . , and sub-channel N−1 (140) may include a phase detector 121, a digital loop filter 122, and a phase rotator 123.

The phase rotator-based CDR architecture shown in FIG. 1 is more suitable for parallel I/O applications than voltage controlled oscillator (VCO) based counterparts considering power and area efficiency. The master channel 110, which has a frequency acquisition loop, spreads a phase-locked clock signal to each sub-channel. The frequency acquisition loop needs a frequency detector (FD, 111) or a phase frequency detector (PFD, 111) due to a limited pull-in range of a phase detector (PD). However, this design does not have operational independency among channels unlike the conventional VCO-based parallel designs. This deficiency arises because a VCO should be phase locked to a data stream in the master channel and the remaining rotator-based sub-channels are subjected to a phase-locked VCO clock signal.

DISCLOSURE OF INVENTION

Technical Problem

An exemplary embodiment of the present invention is directed to the CDR (Clock Data Recovery) device and/or the global clock generator for operating entire CDR channels independently without requiring a master channel and additional circuits while achieving low power and area overhead.

An exemplary embodiment of the present invention is directed to the CDR (Clock Data Recovery) device and/or the global clock generator for operating frequency locked loop (FLL) continuously unlike conventional dual loop phase locked loops (PLLs) where the FLL operates at startup only. Thus low power frequency acquisition is critical and conventional high-power schemes are not suitable for this application.

Solution to Problem

In an aspect of the present invention, the CDR (Clock Data Recovery) device may include at least one or more CDR channels configured to receive input data stream; and a global clock generator configured to provide a frequency locked clock to each of the at least one or more CDR channels, wherein each of the at least one or more CDR channels creates a reference clock signal for the global clock generator.

The global clock generator may provide the frequency locked clock to a phase rotator included in each of the at least one or more CDR channels.

A clock divider included in each of the at least one or more CDR channels may create the reference clock signal for each of at least one or more frequency detectors of the global clock generator.

The global clock generator may include at least one or more frequency detectors corresponding to the at least one or more CDR channels.

The global clock generator may include a frequency locked loop (FLL) digital loop filter configured to combine and accumulate outputs of the at least one or more frequency detectors; and a global VCO configured to generate the frequency locked clock based on an output of the FLL digital loop filter.

The at least one or more CDR channels may operate independently without requiring a master channel.

In another aspect of the present invention, the global clock generator of a CDR (Clock Data Recovery) device, comprising: at least one or more frequency detectors configured to receive a reference clock signal from each of at least one or more CDR channels; and a global VCO configured to provide a frequency locked clock to each of the at least one or more CDR channels based on an output of the at least one or more frequency detectors.

The global clock generator may further comprise an FLL digital loop filter configured to combine and accumulate outputs of the at least one or more frequency detectors.

The global VCO may provide the frequency locked clock to a phase rotator included in each of the at least one or more CDR channels.

The global clock generator may further comprise a clock divider configured to divide the frequency locked clock and to provide the divided frequency locked clock to the at least one or more frequency detectors.

Each of the at least one or more frequency detectors may corresponds to each of the at least one or more CDR channels.

The at least one or more CDR channels may operate independently without requiring a master channel.

Advantageous Effects of Invention

An exemplary embodiment of the present invention is directed to the CDR (Clock Data Recovery) device and/or the global clock generator for operating entire CDR channels independently without requiring a master channel and additional circuits while achieving low power and area overhead.

An exemplary embodiment of the present invention is directed to the CDR (Clock Data Recovery) device and/or the global clock generator for operating frequency locked loop (FLL) continuously unlike conventional dual loop phase locked loops (PLLs) where the FLL operates at startup only. Thus low power frequency acquisition is critical and conventional high-power schemes are not suitable for this application.

BRIEF DESCRIPTION OF DRAWINGS

The accompanying drawings, which are included to provide a further understanding of the invention and are incor- FIG. 1 is a view illustrating an example of a block diagram of a typical rotator-based BB CDR with a clock generator according to an exemplary embodiment of the present invention.

FIG. 2 is a view illustrating an example of a block diagram of a proposed referenceless and masterless phase rotator-based parallel CDR according to an exemplary embodiment of the present invention.

FIG. 3 is a view illustrating an example of a z-domain block diagram of the proposed referenceless and masterless phase rotator-based parallel CDR according to an exemplary embodiment of the present invention.

FIG. 4 is a view illustrating an example of simulated step responses for the a proposed referenceless and masterless phase rotator-based parallel CDR with various gains according to an exemplary embodiment of the present invention.

FIG. 5 is a view illustrating an example of simulated phase noises of the reference clocks for the FD, when the referenceless architectures are SRCG and the proposed scheme, respectively, according to an exemplary embodiment of the present invention.

BEST MODE FOR CARRYING OUT THE INVENTION

Reference will now be made in detail to the preferred embodiments of the present invention, examples of which are illustrated in the accompanying drawings. Wherever possible, the same reference numbers will be used throughout the drawings to refer to the same or like parts.

An exemplary embodiment of the present invention discloses a CDR apparatus with a referenceless and masterless clock generator for phase rotator-based CDRs.

FIG. 2 is a view illustrating an example of a block diagram of a proposed referenceless and masterless phase rotator-based parallel CDR according to an exemplary embodiment of the present invention.

Referring to FIG. 2, FIG. 2 shows the architecture of the proposed referenceless and masterless rotator-based parallel CDR.

A global clock generator (210) includes a frequency detector (211), an FLL digital loop filter (212), a voltage controlled oscillator (213), and a 1/N clock divider (214). Also, each of CDR channels (220-250) includes a phase rotator (221), a phase detector (222), CDR digital loop filter (223) and a clock divider (224).

The global clock generator (210) is configured to provide frequency locked clocks to a digitally controlled phase rotator (221) of each of CDR channels (220-250). And, the clock divider (214) followed by the phase rotator (221) creates a reference clock signal for the frequency detector (211, FD).

The outputs of FDs (211) corresponding to CDR channels (220-250) are combined together and then accumulated in the digital domain for the control of a global VCO (213) by the FLL digital loop filter (212). Thus, the global VCO (213) can be frequency locked provided that an input signal is present in any one of the CDR channels (220-250), which endows a masterless operation. Note that the outputs of PDs (222) cannot be combined due to phase ambiguity. Entire CDR channels (220-250) operate independently without requiring a master channel and additional circuits while achieving low power and area overhead.

In an exemplary embodiment of the present invention, the frequency locked loop (FLL) operates continuously unlike conventional dual loop phase locked loops (PLLs) where the FLL operates at startup only. Thus low power frequency acquisition is critical and conventional high-power schemes are not suitable for this application. A phase rotator (221) outputs a clock for the corresponding CDR channel (220) based frequency acquisition scheme consumes significantly less power compared to conventional designs since it requires simple clock divider (224) operated at divided rates. Even though another on-chip reference clock generators or referenceless frequency detectors (e.g. stochastic reference clock generator (SRCG), rotational frequency detector, etc.) are needed for the initial frequency acquisition to cover the limited pull-in range of the CDR, the power consumption from these have negligible impact on the system level performance because the additional blocks operate just at startup only.

Global clock generator distributes the VCO clock signal to each CDR channel and then the phase rotator is controlled to minimize the phase difference between the input data and the clock signal. The frequency-divided output of the phase rotator is utilized as a reference clock signal of FD because the $2^{nd}$-order rotator loop compensates the frequency offset between the VCO clock signal and the input data rate, and suppresses the low-frequency jitter of the DCO clock signal via high-pass filtering. This divided rotator clock reduces the low-frequency phase noise of the DCO and consequently makes the rotator output clock cleaner. Such bootstrapping reduces the phase noise of both FLL and PLL in steady state. Consequently, the DCO generates a clean clock signal, which frequency is locked in the presence of an input data rate in any channel, for the phase rotator in each channel. In addition, this scheme ensures stable operation irrespective of the transition probabilities of the input data, unlike SRCG.

FIG. 3 shows the Z-domain block diagram of the proposed CDR. The worst-case low frequency jitter of the FLL-filtered DC clock, which the rotator loop should track, approaches twice that of the input accumulation jitter. Therefore, the phase rotator loop should be designed in $2^{nd}$-order to track the elevated low frequency jitter without increasing the closed loop bandwidth and degrading the output clock jitter. By taking the bi-linear transformation for simplicity, the closed-loop transfer function, T(s), is given by $$T(s) = \frac{\phi_{rotator}}{\phi_{in}} = \frac{K_{PD}\theta_{pr}\left(\frac{\beta(1+sT_{unit}/2)}{sT_{unit}} + \frac{\alpha(1+sT_{unit}/2)^2}{s^2T_{unit}^2}\right)}{K_{PD}\theta_{pr}\left(\frac{\beta(1+sT_{unit}/2)}{sT_{unit}} + \frac{\alpha(1+sT_{unit}/2)^2}{s^2T_{unit}^2}\right) + \frac{Ns}{Ns+K_{VCO}\gamma}}, \quad (1)$$

where $\phi_m$, $\phi_{rotator}$, $K_{vco}$, $K_{PD}$, $\theta_{Pr}$, $\alpha$, $\beta$, and $\gamma$ denote the input phase, the rotator clock phase, the gain of VCO, the gain of PD, the gain of a phase rotator, the integral path gain, the proportional path gain, and the FLL forwarded gain, respectively, and $T_{unit}$ is an unit interval. This is a stable system that has a closed-loop transfer function with poles only in the left half-plane. However, the FLL loop bandwidth should be smaller than the CDR loop bandwidth for the masterless operation. If the FLL loop bandwidth is bigger than the CDR loop bandwidth, the operational dependency among channels increases noticeably. Also $\beta$ should be bigger than a not to have overshoot and to guarantee the phase margin of the system.

FIG. 4 shows simulated step response for the system with various as, where $\theta_{Pr} = 1/128$, $N=1024$, $T_{unit}=100$ ps, $K_{PD}=1$, and $K_{vco}=100$ MHz/LSB, respectively. The results clearly show that the overshoot is deceased when $\beta/\alpha$ is increased.

Steady-state error can be calculated from T(s). The relationship between the steady-state error, $e(\infty)$, and T(s) is $$e(\infty) = \lim_{s \to 0} sR(s)(1 - T(s)) \quad (2)$$

where, R(s) is the s-domain representation of the input. If there is a frequency offset in the input, R(s) can be represented as $A/s^2$, where A is a real number. In this case, (2) becomes $$e(\infty) = \lim_{s \to 0} \frac{A\left(1 - \frac{K_{VCO}\gamma}{Ns + K_{VCO}\gamma}\right)}{K_{PD}\theta_{pr}\left(\frac{\beta(1 + sT_{unit}/2)}{T_{unit}} + \frac{\alpha(1 + sT_{unit}/2)^2}{sT_{unit}^2}\right) + \frac{Ns^2}{Ns + K_{VCO}\gamma}} = 0 \quad (3)$$

If there is a parabolic input, $R(s)=A/s^2$, (2) becomes $$e(\infty) = \lim_{s \to 0} \frac{A\left(1 - \frac{K_{VCO}\gamma}{Ns + K_{VCO}\gamma}\right)}{K_{bbpd}\theta_{pr}\left(\frac{s\beta(1 + sT_{unit}/2)}{T_{unit}} + \frac{\alpha(1 + sT_{unit}/2)^2}{T_{unit}^2}\right) + \frac{Ns^3}{Ns + K_{VCO}\gamma}} = 0. \quad (4)$$

FIG. 5 shows the simulated phase noises of the reference clocks for the FD, when the referenceless architectures are SRCG and the proposed scheme, respectively.

The result clearly shows that the proposed scheme's reference clock is much cleaner than the SRCG counterpart.

MODE FOR THE INVENTION

It will be apparent to those skilled in the art that various modifications and variations can be made in the present invention without departing from the spirit or scope of the inventions. For example, the above-described techniques may be executed in an order different from that described in the description of the present invention, and/or the components of the above-described system, structure, equipment (or device), circuit, and so on, may be combined in a format different that of the above-described method according to the present invention, and an adequate result may be achieved even if the above-described components of the present invention are replaced by any other component or its equivalent.

Thus, it is intended that the present invention covers other realizations and other embodiments of this invention provided they come within the scope of the appended claims and their equivalents.

The invention claimed is:

1. The CDR (Clock Data Recovery) device, comprising: at least one or more CDR channels configured to receive input data stream; and a global clock generator configured to provide a frequency locked clock to each of the at least one or more CDR channels, wherein each of the at least one or more CDR channels creates a reference clock signal for the global clock generator, and wherein the global clock generator provides the frequency locked clock to a phase rotator included in each of the at least one or more CDR channels.

2. The CDR device of claim 1, wherein the at least one or more CDR channels operate independently without requiring a master channel.

3. A CDR (Clock Data Recovery) device, comprising: at least one or more CDR channels configured to receive input data stream; and a global clock generator configured to provide a frequency locked clock to each of the at least one or more CDR channels, wherein each of the at least one or more CDR channels creates a reference clock signal for the global clock generator, and wherein a clock divider included in each of the at least one or more CDR channels creates the reference clock signal for each of at least one or more frequency detectors of the global clock generator.

4. A CDR (Clock Data Recovery) device, comprising: at least one or more CDR channels configured to receive input data stream; and a global clock generator configured to provide a frequency locked clock to each of the at least one or more CDR channels, wherein each of the at least one or more CDR channels creates a reference clock signal for the global clock generator, wherein the global clock generator includes at least one or more frequency detectors corresponding to the at least one or more CDR channels, and wherein the global clock generator includes: a frequency locked loop (FLL) digital loop filter configured to combine and accumulate outputs of the at least one or more frequency detectors; and a global VCO configured to generate the frequency locked clock based on an output of the FLL digital loop filter.

5. A global clock generator of a CDR (Clock Data Recovery) device, comprising: at least one or more frequency detectors configured to receive a reference clock signal from each of at least one or more CDR channels; a global VCO configured to provide a frequency locked clock to each of the at least one or more CDR channels based on an output of the at least one or more frequency detectors; and a frequency locked loop (FLL) digital loop filter configured to combine and accumulate outputs of the at least one or more frequency detectors.

6. The global clock generator of claim 5, wherein each of the at least one or more frequency detectors corresponds to each of the at least one or more CDR channels.

7. The global clock generator of claim 5, wherein the at least one or more CDR channels operate independently without requiring a master channel.

8. A global clock generator of a CDR (Clock Data Recovery) device, comprising: at least one or more frequency detectors configured to receive a reference clock signal from each of at least one or more CDR channels; and a global VCO configured to provide a frequency locked clock to each of the at least one or more CDR channels based on an output of the at least one or more frequency detectors, wherein the global VCO provides the frequency locked clock to a phase rotator included in each of the at least one or more CDR channels.

9. A global clock generator of a CDR (Clock Data Recovery) device, comprising: at least one or more frequency detectors configured to receive a reference clock signal from each of at least one or more CDR channels; a global VCO configured to provide a frequency locked clock to each of the at least one or more CDR channels based on an output of the at least one or more frequency detectors; and a clock divider configured to divide the frequency locked clock and to provide the divided frequency locked clock to the at least one or more frequency detectors.

* * * * *